(12) United States Patent
Inoue et al.

(10) Patent No.: US 11,815,407 B2
(45) Date of Patent: Nov. 14, 2023

(54) THERMOCOUPLE STRUCTURE, HEAT TREATMENT APPARATUS, AND METHOD OF MANUFACTURING THERMOCOUPLE STRUCTURE

(71) Applicants: Tokyo Electron Limited, Tokyo (JP); Furuya Metal Co., Ltd., Tokyo (JP)

(72) Inventors: Hisashi Inoue, Iwate (JP); Masahiro Kobayashi, Iwate (JP); Yasuaki Kikuchi, Iwate (JP); Tatsuya Yamaguchi, Iwate (JP); Koji Yoshii, Iwate (JP); Kensuke Morita, Tokyo (JP); Jun Itabashi, Tokyo (JP)

(73) Assignees: Tokyo Electron Limited, Tokyo (JP); Furüya Metal Co., Ltd., Tokyo (JP)

( * ) Notice: Subject to any disclaimer, the term of this patent is extended or adjusted under 35 U.S.C. 154(b) by 173 days.

(21) Appl. No.: 17/007,009

(22) Filed: Aug. 31, 2020

(65) Prior Publication Data
US 2021/0063247 A1 Mar. 4, 2021

(30) Foreign Application Priority Data

Sep. 3, 2019 (JP) .................................. 2019-160679

(51) Int. Cl.
*G01K 7/02* (2021.01)
*G01K 1/08* (2021.01)
*H10N 19/00* (2023.01)

(52) U.S. Cl.
CPC .................. *G01K 7/02* (2013.01); *G01K 1/08* (2013.01); *H10N 19/00* (2023.02)

(58) Field of Classification Search
CPC .. G01K 7/02; G01K 1/08; G01K 1/14; G01K 3/14; G01K 3/06; G01K 7/04
USPC .......................... 374/179, 166, 110, 112, 208
See application file for complete search history.

(56) References Cited

U.S. PATENT DOCUMENTS

| | | | |
|---|---|---|---|
| 3,393,101 A * | 7/1968 | Kirkpatrick ............ | G01K 13/02 374/E13.006 |
| 3,716,417 A * | 2/1973 | Evans ...................... | G01K 7/02 374/E7.004 |
| 4,747,700 A * | 5/1988 | Lenz ....................... | G01K 1/12 374/E1.016 |
| 2005/0259719 A1 * | 11/2005 | Phillips ................... | G01K 7/04 374/208 |

FOREIGN PATENT DOCUMENTS

| | | | | |
|---|---|---|---|---|
| CN | 109443580 A | * | 3/2019 | ............... G01K 7/02 |
| GB | 974070 A | * | 11/1964 | |
| JP | S45-011103 U | | 5/1970 | |
| JP | S57-086439 U | | 5/1982 | |
| JP | S58-222582 | | 12/1983 | |
| JP | S59-125851 U | | 8/1984 | |

(Continued)

*Primary Examiner* — Mirellys Jagan
(74) *Attorney, Agent, or Firm* — IPUSA, PLLC

(57) ABSTRACT

A thermocouple structure according to one aspect of the present disclosure includes a first element wire, second element wires formed of a material different from the first element wire, an insulating covering member covering at least one of the first element wire and the second element wires, and a protective tube accommodating the first element wire and the second element wire. Each of the second element wires is bonded to a different position on the first element wire.

3 Claims, 8 Drawing Sheets

(56) References Cited

FOREIGN PATENT DOCUMENTS

| | | |
|---|---|---|
| JP | S60-083933 U | 6/1985 |
| JP | S61-110135 U | 7/1986 |
| JP | 2008-058089 | 3/2008 |
| JP | 2009-075003 | 4/2009 |
| JP | 2011-151055 | 8/2011 |
| JP | 2016-157930 | 9/2016 |
| JP | 2017-032406 | 2/2017 |
| JP | 2018-25525 | 2/2018 |
| WO | 2015/041315 | 3/2015 |

\* cited by examiner

THERMOCOUPLE STRUCTURE, HEAT TREATMENT APPARATUS, AND METHOD OF MANUFACTURING THERMOCOUPLE STRUCTURE

CROSS-REFERENCE TO RELATED APPLICATIONS

This patent application is based upon and claims priority to Japanese Patent Application No. 2019-160679 filed on Sep. 3, 2019, the entire contents of which are incorporated herein by reference.

TECHNICAL FIELD

The present disclosure relates to a thermocouple structure, a heat treatment apparatus, and a method of manufacturing a thermocouple structure.

BACKGROUND

A thermocouple structure having multiple temperature measuring portions is known (see Patent Documents 1 to 3, for example). In addition, a thermocouple including two wires and a clamping member is known, in which the clamping member clamps the two wires while an end of one of the two wires is in contact with an end of the other one of the two wires in parallel, to form a temperature measuring junction (see Patent Document 4 for example).

RELATED ART DOCUMENTS

Patent Documents

[Patent Document 1] Japanese Unexamined Patent Application Publication No. 2011-151055
[Patent Document 2] Japanese Unexamined Patent Application Publication No. 58-222582
[Patent Document 3] Japanese Unexamined Utility Model Application Publication No. 61-110135
[Patent Document 4] Japanese Unexamined Patent Application Publication No. 2018-25525

SUMMARY

The present disclosure provides a technique for attaining space saving of a thermocouple structure having multiple temperature measuring portions.

A thermocouple structure according to one aspect of the present disclosure includes a first element wire, second element wires formed of a material different from the first element wire, an insulating covering member covering at least one of the first element wire and the second element wires, and a protective tube accommodating the first element wire and the second element wires. Each of the second element wires is bonded to a different position on the first element wire.

DETAILED DESCRIPTION OF EMBODIMENTS

Figure 1:
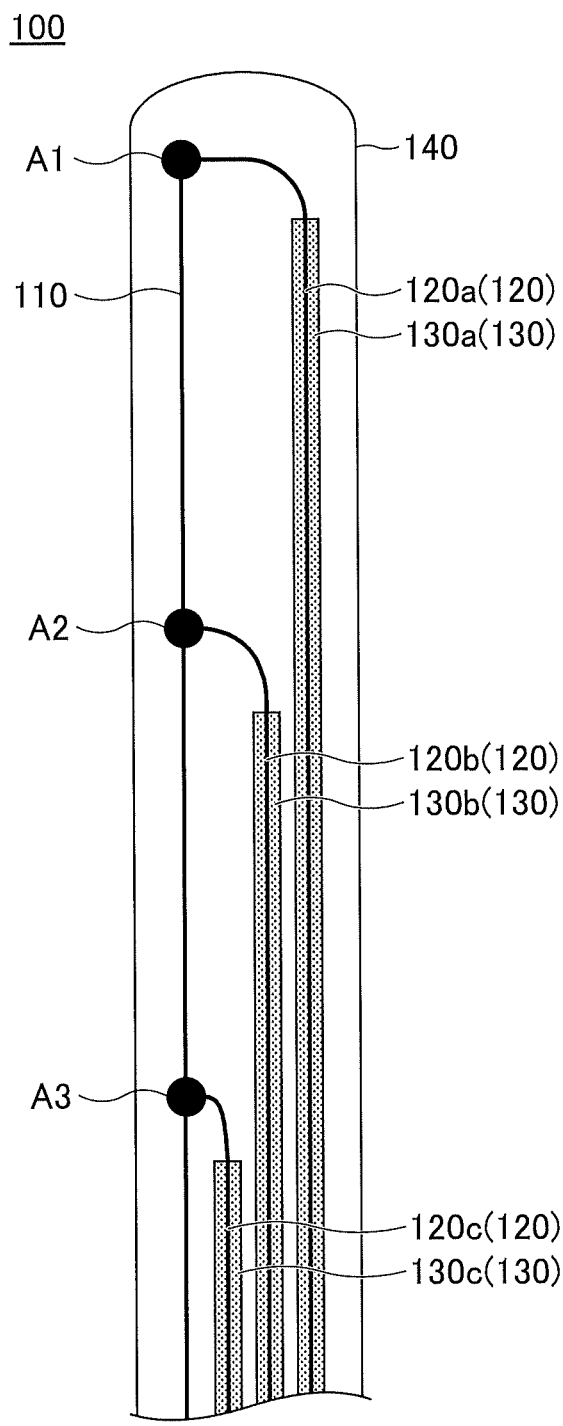
FIG. 1 is a diagram illustrating an example of the configuration of a thermocouple structure according to a first embodiment.

Hereinafter, non-limiting exemplary embodiments of the present disclosure will be described with reference to the accompanying drawings. In all the accompanying drawings, the same or corresponding reference numerals shall be attached to the same or corresponding components and overlapping descriptions may be omitted.

First Embodiment (Thermocouple Structure)

Figure 2:
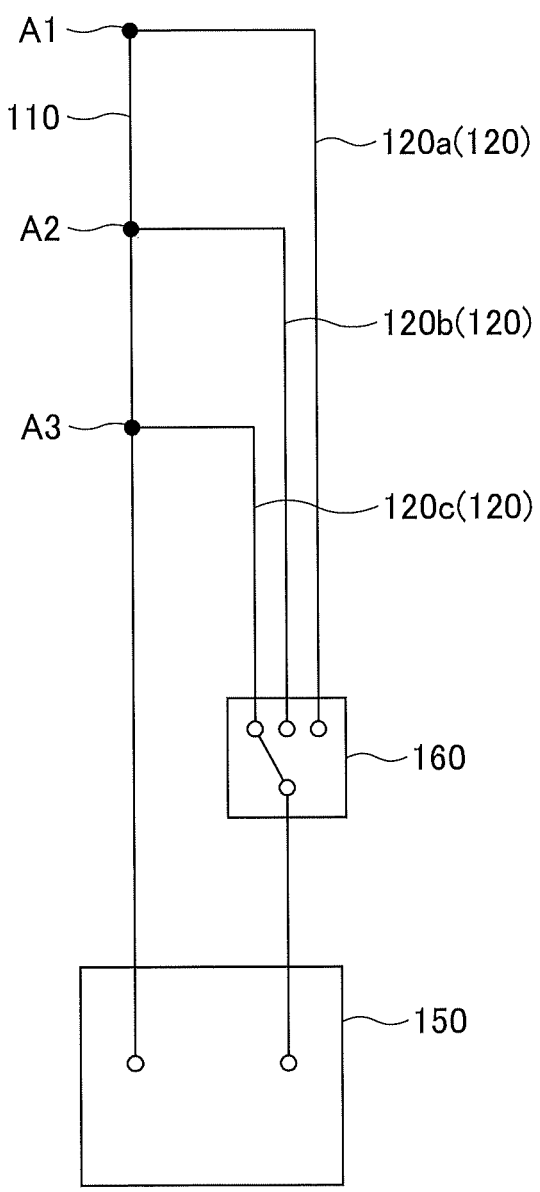
FIG. 2 is an explanatory diagram illustrating an example of a temperature measurement method using the thermocouple structure.

An example of a thermocouple structure according to a first embodiment will be described. FIG. 1 is a diagram illustrating the example of the thermocouple structure according to the first embodiment. FIG. 2 is an explanatory diagram illustrating an example of a temperature measurement method using the thermocouple structure.

As illustrated in FIGS. 1 and 2, the thermocouple structure 100 includes a first element wire for thermocouple 110, second element wires for thermocouple 120, covering members 130, a protective tube 140, a measuring instrument 150, and a switching device 160. In the following, the first element wire for thermocouple 110 and the second element wires for thermocouple 120 may also be referred to as a "first element wire 110" and "second element wires 120", respectively. In FIG. 1, illustration of the measuring instrument 150 and the switching device 160 is omitted. In FIG. 2, illustration of the covering members 130 and the protective tube 140 is omitted.

The first element wire 110 and the second element wire 120 constitute a thermocouple. One end (tip) of the first element wire 110 is bonded to one of the second element wires 120, and the other end of the first element wire 110 is connected to the measuring instrument 150. The first element wire 110 may be formed of a single wire, or may be formed by bonding multiple wires. As a material of the first element wire 110, a metal conductor, such as platinum or platinum rhodium alloy, can be used, although not particularly limited.

Each of the second element wires 120 is formed of a material different from the first element wire 110, and the second element wires 120 and the first element wire 110 constitute the thermocouples. In the thermocouple structure 100 according to the present embodiment, as the second element wire 120, a second element wire 120a, a second element wire 120b, and a second element wire 120c are included. In the present embodiment, in a case in which the second element wires 120a, 120b, and 120c are not required to be distinguished each other, the second element wires 120a, 120b, and 120c may be referred to as the "second element wires 120".

One end of the second element wire 120a is bonded to a tip of the first element wire 110, to form a temperature measuring portion A1 together with the first element wire 110. One end of the second element wire 120b is bonded to the first element wire 110 at a position away from the tip of the first element wire 110 by a predetermined distance toward the other end of the first element wire 110, to form a temperature measuring portion A2 together with the first element wire 110. One end of the second element wire 120c is bonded to the first element wire 110 at a position away from the temperature measuring portion A2 by a predetermined distance toward the other end of the first element wire 110, to form a temperature measuring portion A3 together with the first element wire 110.

The distance between the temperature measuring portion A1 and the temperature measuring portion A2, and the distance between the temperature measuring portion A2 and the temperature measuring portion A3 are set according to locations whose temperatures are measured, and may be the same or different. The other end of each of the second element wires 120a, 120b, and 120c is connected to the measuring instrument 150 via the switching device 160.

Materials of the second element wires 120a, 120b, and 120c are not particularly limited, but a metal conductor such as platinum or a platinum rhodium alloy can be used. As an example, if the material of the first element wire 110 is platinum, a platinum rhodium alloy may be used as the material of the second element wires 120a, 120b, and 120c.

The number of the second element wires 120 is not limited to three as described above, and may be determined in accordance with the number of locations whose temperatures are measured. For example, the number of the second element wires 120 may be two, four, or more than four.

The covering members 130 are insulating members that cover the second element wires 120. The covering members 130 prevent the first element wire 110 from contacting the second element wires 120. The covering members 130 are provided for the respective second element wires 120a, 120b, and 120c. In the present embodiment, the covering member 130 that covers the second element wire 120a, the covering member 130 that covers the second element wire 120b, and the covering member 130 that covers the second element wire 120c may be referred to as covering members 130a, 130b, and 130c, respectively.

The covering members 130a, 130b, and 130c are insulating tubes that cover the second element wires 120a, 120b, and 120c, respectively, by the second element wires 120a, 120b, and 120c being inserted into the interior of the covering members 130a, 130b, and 130c, respectively. Examples of a material of the insulating tube include, but are not limited to, alumina ($Al_2O$), magnesia (MgO), zirconia ($ZrO_2$), ceramic such as aluminum titanate ($Al_2O_3 \cdot TiO_2$), quartz, and silicon carbide (SiC).

The covering member 130 may be an insulating member capable of covering the second element wire 120. For example, an insulating bead or an insulating sheet may be used. If an insulating bead is used, the second element wire 120 can be covered and insulated by attaching multiple insulating beads to the second element wire 120. If an insulating sheet is used, the second element wire 120 can be covered and insulated by wrapping the insulating sheet around the second element wire 120.

The covering member 130 may also cover the first element wire 110 instead of the second element wire 120. In addition, the covering member 130 may cover both the first element wire 110 and the second element wires 120.

A protective tube 140 accommodates the first element wire 110 and the second element wires 120. The protective tube 140 is formed of, for example, quartz or SiC.

The measuring instrument 150 measures a temperature based on thermal electromotive force generated by the first and second element wires 110 and 120. For example, a data logger may be used as the measuring instrument 150.

The switching device 160 switches a state of connection between the measuring instrument 150 and the second element wires 120a, 120b, and 120c. By switching the connection between the measuring instrument 150 and the second element wires 120a, 120b, and 120c, temperatures at the temperature measuring portions A1 to A3 can be measured. For example, when the switching device 160 is switched to connect the second element wire 120a to the measuring instrument 150, the temperature of the temperature measuring portion A1 can be measured. The measuring instrument 150 and the switching device 160 are connected via a wire formed of the same material as the second element wire 120. However, the measuring instrument 150 and the switching device 160 may be connected via a compensating lead wire.

According to the thermocouple structure 100 described above, a multi-junction thermocouple having three temperature measuring portions A1 to A3 is formed by the first element wire 110 and the three second element wires 120 each constituting a thermocouple with the first element wire 110. As a result, the number of element wires for thermocouple can be reduced in a case of measuring temperatures at multiple points, so that space can be saved and manufacturing cost can be reduced. Specifically, when a thermocouple formed by a pair of element wires for thermocouple is used, six element wires for thermocouple are required. However, in a case in which the thermocouple structure 100 is employed, the total number of element wires for thermocouple can be four, i.e., a single first element wire 110 and three second element wires 120. Therefore, the number of element wires for thermocouple can be reduced.

(Temperature Measuring Portions)

An example of the configuration of the temperature measuring portions A1 to A3 of the thermocouple structure 100 of FIG. 1 will be described with reference to the temperature measuring portion A2.

Figure 3:
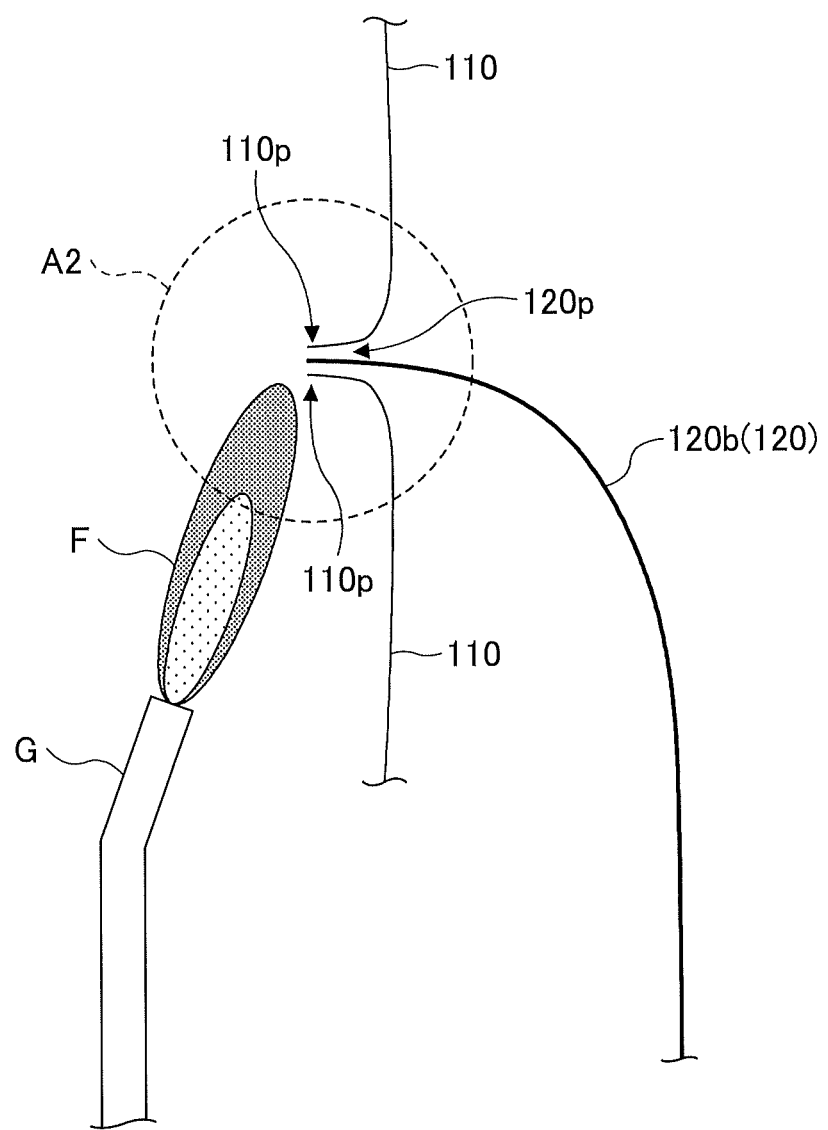
FIG. 3 is a diagram illustrating an example of a temperature measuring portion of the thermocouple structure.

FIG. 3 is a diagram illustrating an example of the temperature measuring portion A2 of the thermocouple structure 100. As illustrated in FIG. 3, the temperature measuring portion A2 is formed by two first element wires 110 and a second element wire 120 (120b) that is welded to a tip 110p of each of the two first element wires 110. In other words, by the tips 110p of the respective two first element wires 110 and the tip 120p of the second element wire 120 being welded together, the temperature measuring portion A2 is formed.

The method of forming a welded junction is not particularly limited. For example, gas welding or spot welding may be used. FIG. 3 illustrates an example of gas welding using a flame F blown out from a gas jet G.

Figure 4:
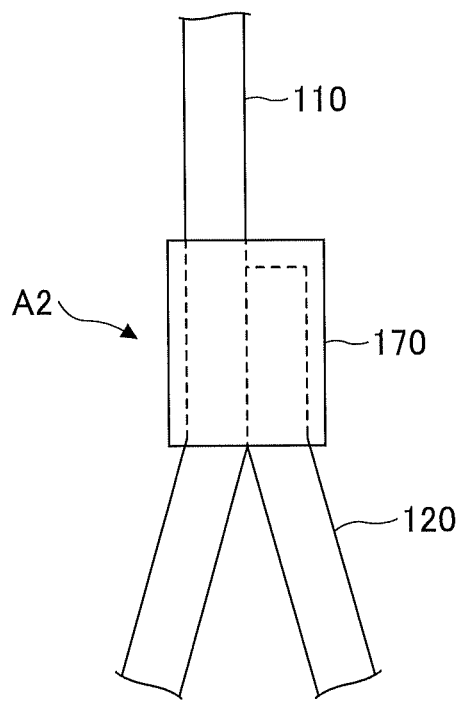
FIG. 4 is a diagram illustrating another example of the temperature measuring portion of the thermocouple structure.

FIG. 4 is a diagram illustrating another example of the temperature measuring portion A2 of the thermocouple structure 100. As illustrated in FIG. 4, the temperature measuring portion A2 is formed of a first element wire 110, a second element wire 120, and a clamping member 170.

The clamping member 170 clamps a portion in the middle of the first element wire 110 and a tip of the second element wire 120 in contact with each other, to form the temperature measuring portion A2. The clamping member 170 may be, for example, a cylindrical member, or may be a plate-like member that is rounded to a cylindrical shape. The clamping member 170 is formed of a metal conductor, such as platinum or platinum rhodium. Preferably, the material of the clamping member 170 is the same as the material of the first element wire 110 or the second element wire 120, from the viewpoint of suppressing the generation of thermoelectric force caused by contact of different materials.

The method of forming the temperature measuring portion A2 using the clamping member 170 is not particularly limited, but for example, crimping may be used. Specifically, the first element wire 110 and the second element wire 120 are inserted into the clamping member 170 in a state in which the portion in the middle of the first element wire 110 (i.e., the portion at which the temperature measuring portion A2 is to be formed) and the tip of the second element wire 120 are arranged side by side in the cylindrical portion of the clamping member 170. Then, by flattening the clamping member 170, the temperature measuring portion A2 is formed.

As described above, in the example illustrated in FIG. 4, the temperature measuring portion A2 is formed by the first element wire 110 and the second element wire 120 that is bonded to the middle of the first element wire 110 by crimping. Therefore, a risk of disconnection of the first element wire 110 and the second element wire 120, caused by expansion or contraction of the first element wire 110 and the second element wire 120 due to heat, can be reduced.

Further, in the example illustrated in FIG. 4, after the first element wire 110 and the second element wire 120 are disposed in parallel in the cylindrical portion of the clamping member 170, the clamping member 170 is flattened to form the temperature measuring portion A2. Therefore, because it is easy to form the temperature measuring portion A2 at a desired position, accuracy of positioning is improved.

Figure 5:
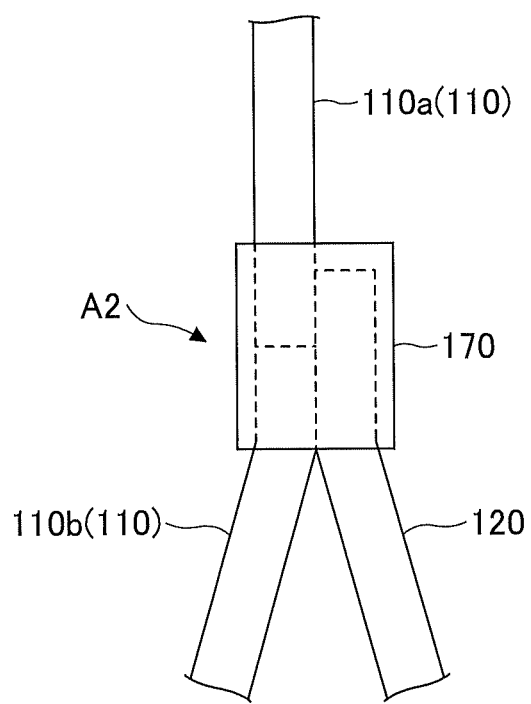
FIG. 5 is a diagram illustrating yet another example of the temperature measuring portion of the thermocouple structure.

FIG. 5 is a diagram illustrating yet another example of the temperature measuring portion A2 of the thermocouple structure 100. As illustrated in FIG. 5, the temperature measuring portion A2 is formed by two first element wires 110a and 110b, a second element wire 120, and a clamping member 170.

The clamping member 170 clamps the two first element wires 110a and 110b and the second element wire in a state in which a tip of each of the two first element wires 110a and 110b and a tip of the second element wire 120 are in contact with each other, to form the temperature measuring portion A2.

The method of forming the temperature measuring portion A2 using the clamping member 170 is not particularly limited, but for example, crimping may be used. Specifically, first, the respective tips of the first element wires 110a and 110b and the second element wires 120 are disposed within the cylindrical portion of the clamping member 170 in a state in which the tip of the first element wire 110a abuts the tip of the first element wire 110b and in which the tip the second element wires 120 is adjacently arranged in parallel with the first element wires 110a and 110b. Then, the clamping member 170 is flattened to form the temperature measuring portion A2.

As described above, in the example illustrated in FIG. 5, by bonding the tips of the two first element wires 110 and the tip of the second element wire 120 by crimping, the temperature measuring portion A2 is formed. Therefore, a risk of disconnection of the first element wires 110 and the second element wire 120, caused by expansion or contraction of the first element wires 110 and the second element wire 120 due to heat, can be reduced.

Further, in the example illustrated in FIG. 5, after the tips of the first element wires 110a and 110b and the second element wires 120 are disposed within the cylindrical portion of the clamping member 170 in a state in which the tip of the first element wire 110a abuts the tip of the first element wire 110b and in which the tip the second element wires 120 is adjacently arranged in parallel with the first element wires 110a and 110b, the clamping member 170 is flattened to form the temperature measuring portion A2. Therefore, because it is easy to form the temperature measuring portion A2 at a desired position, accuracy of positioning is improved.

(Heat Treatment Apparatus)

Figure 6:
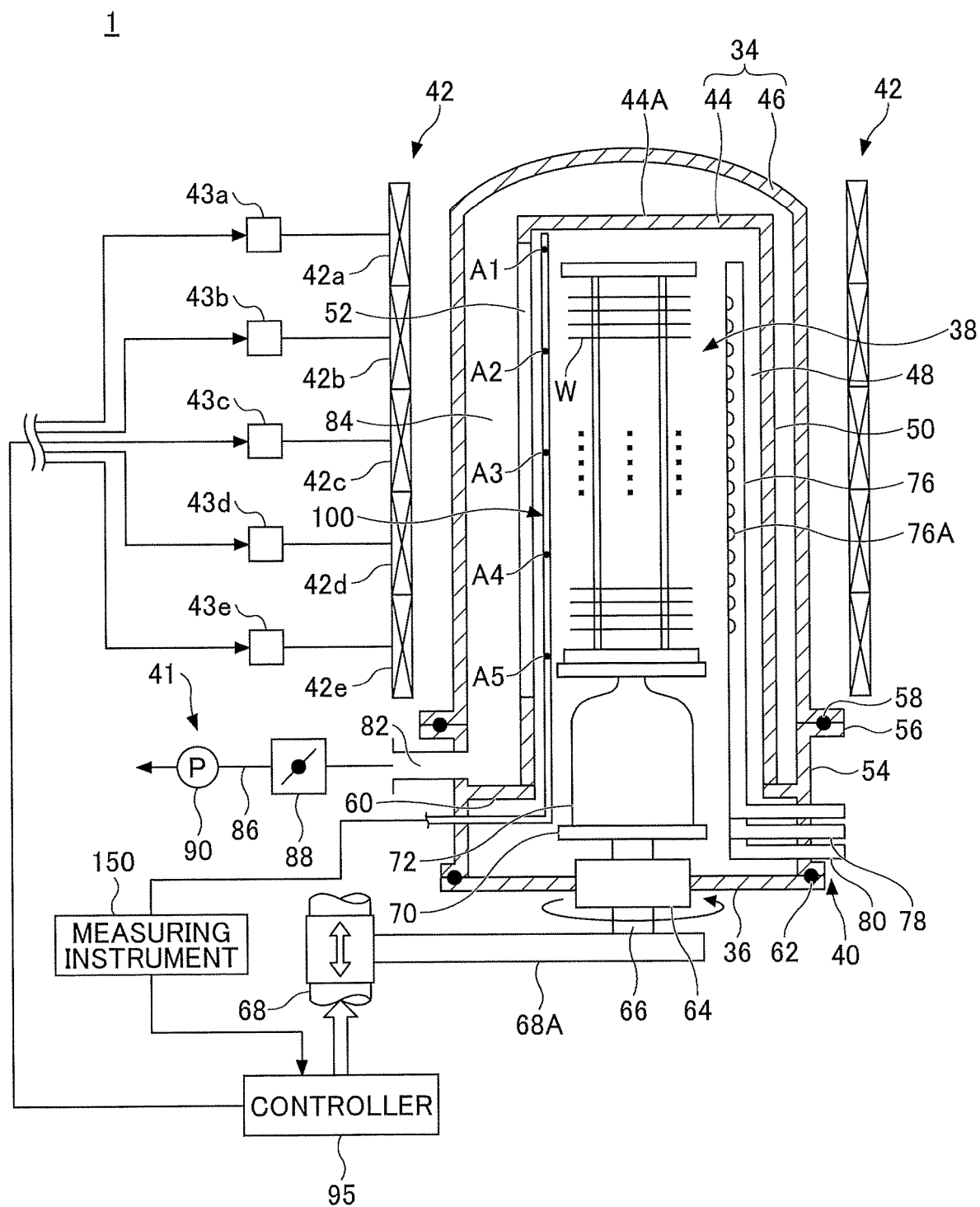
FIG. 6 is a diagram illustrating an example of the configuration of a heat treatment apparatus including the thermocouple structure.
Figure 7:
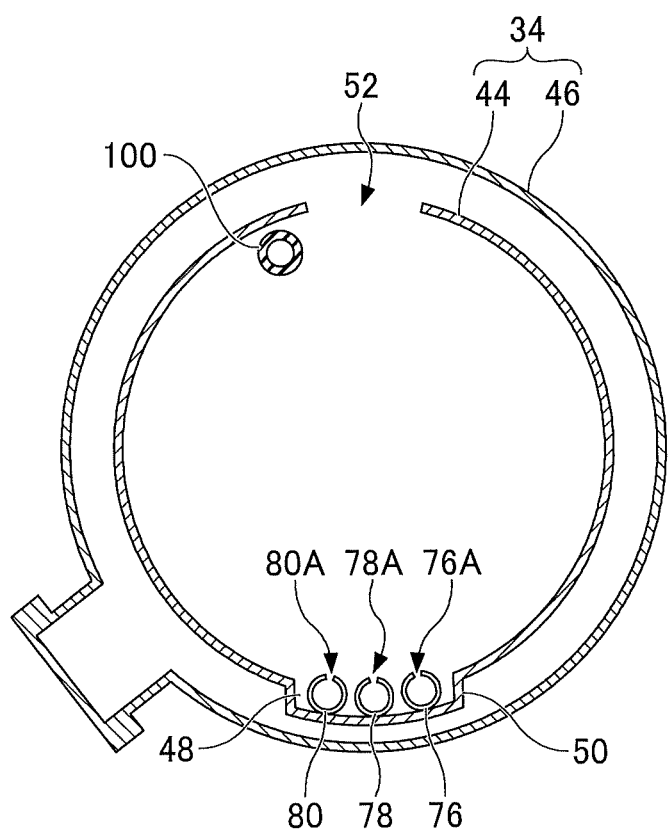
FIG. 7 is a diagram illustrating a process chamber of the heat treatment apparatus of FIG. 6.

A heat treatment apparatus equipped with the thermocouple structure 100 will be described with reference to a batch-type heat treatment apparatus, in which heat treatment can be applied to multiple substrates while a substrate holding device holds the multiple substrates in multiple stages in a process chamber. However, the heat treatment apparatus equipped with the thermocouple structure 100 is not limited to the batch-type heat treatment apparatus, and the thermocouple structure 100 may also be applied to, for example, a single-wafer heat treatment apparatus. FIG. 6 is a diagram illustrating an example of the configuration of the heat treatment apparatus including the thermocouple structure 100. FIG. 7 is a diagram illustrating a process chamber of the heat treatment apparatus of FIG. 6.

As illustrated in FIG. 6, the heat treatment apparatus 1 includes a process chamber 34, a lid 36, a wafer boat 38, a gas supply section 40, an exhaust section 41, and a heater 42.

The process chamber 34 is a tall (longer in a vertical direction relative to a horizontal direction) container accommodating the wafer boat 38. The wafer boat 38 is a substrate holding device that holds a large number of semiconductor wafers (hereinafter referred to as "wafers W") at predetermined intervals. The process chamber 34 includes a cylindrically shaped inner tube 44 whose bottom end is opened, and includes a cylindrically shaped outer tube 46 covering the outside of the inner tube 44. The bottom end of the outer tube 46 is also opened. The inner tube 44 and the outer tube 46 are formed of a heat-resistant material, such as quartz, and are arranged coaxially to form a dual tube structure.

The ceiling portion 44A of the inner tube 44 is flat, for example. A nozzle housing 48 is formed on one side of the inner tube 44 to accommodate gas supply pipes along the longitudinal direction (vertical direction) of the inner tube 44. For example, as illustrated in FIG. 7, a portion of the side wall of the inner tube 44 protrudes outward to form a recess 50, and the inside of the recess 50 is formed as the nozzle housing 48. A rectangular opening 52 is formed in the side wall of the inner tube 44 opposite the nozzle housing 48 along the longitudinal direction (vertical direction) of the inner tube 44.

The opening 52 is a gas exhaust port, which is formed to evacuate gas in the inner tube 44. The opening 52 is formed such that the vertical length of the opening 52 is equal to or greater than that of the wafer boat 38. In a case in which the vertical length of the opening 52 is greater than that of the wafer boat 38, the opening 52 is formed such that its upper end is positioned higher than the upper end of the wafer boat 38 and its lower end is positioned lower than the lower end of the wafer boat 38.

The lower end of the process chamber 34 is supported by a cylindrical manifold 54 formed of, for example, stainless steel. A flange 56 is formed on the upper end of the manifold 54. The lower end of the outer tube 46 is disposed on the flange 56, and is supported by the flange 56. A sealing member 58, such as an O-ring, is interposed between the flange 56 and the lower end of the outer tube 46 to keep the interior of the outer tube 46 airtight.

An annular support 60 is provided on the inner wall of the upper portion of the manifold 54. The lower end of the inner tube 44 is placed on the support 60, and is supported by the support 60. To the opening of the manifold 54, which is provided at the lower end of the manifold 54, the lid 36 is hermetically attached via a sealing member 62, such as an O-ring, to airtightly seal the opening of the process chamber 34 at its lower end, i.e., the opening of the manifold 54. The lid 36 is formed of, for example, stainless steel.

A rotating shaft 66 is attached to the center of the lid 36 in a plan view, via a ferrofluidic seal 64. The lower portion of the rotating shaft 66 is rotatably supported on an arm 68A of a lifting device 68 including a boat elevator.

A rotary plate 70 is provided at the upper end of the rotating shaft 66. On the rotary plate 70, the wafer boat 38 for holding the wafers W is disposed via a heat insulating platform 72 made of quartz. Accordingly, by actuating the lifting device 68, the lid 36 and the wafer boat 38 are moved up and down together. That is, the wafer boat 38 can be inserted into and removed from the process chamber 34 by the lifting device 68.

The gas supply section 40 is provided at the manifold 54, and introduces gases, such as a deposition gas, an etching gas, or a purge gas, into the inner tube 44. The gas supply section 40 includes multiple (e.g., three) gas supply pipes 76, 78, and 80, which are made of quartz. The gas supply pipes 76, 78, and 80 are provided within the inner tube 44 along its longitudinal direction. A lower end portion of each of the gas supply pipes 76, 78, and 80 is bent in an L-shape, and is supported so as to penetrating the manifold 54.

Within the nozzle housing 48 of the inner tube 44, the gas supply pipes 76, 78, and 80 are arrayed along a circumferential direction of the inner tube 44, as illustrated in FIG. 7. On the gas supply pipe 76, multiple gas holes 76A are provided at predetermined intervals along the longitudinal direction of the gas supply pipe 76, to discharge gas horizontally from the gas holes 76A. Similarly, gas holes 78A and gas holes 80A are provided on the gas supply pipes 78 and 80, respectively, at predetermined intervals along the longitudinal directions of the gas supply pipes 78 and 80, to discharge gases horizontally from the gas holes 78A and 80A respectively. The predetermined intervals between the gas holes 76A (or gas holes 78A or 80A) are set, for example, to be the same as the distance between wafers W supported by the wafer boat 38. In addition, a vertical position (height) of each of the gas holes 76A, 78A, and 80A is set such that each of the gas holes 76A, 78A, and 80A is positioned at a height corresponding to the middle height position between two wafers W adjacently arranged in the vertical direction on the wafer boat 38, so that gases can be efficiently supplied to spaces between wafers W. Types of gas to be discharged from the gas holes 76A, 78A, and BOA include a deposition gas, an etching gas, and a purge gas, and the heat treatment apparatus 1 is configured to supply these gases via the gas supply pipes 76, 78, and 80 as required while controlling the flow rate.

Above the support 60, a gas outlet 82 is formed at the upper portion of the side wall of the manifold 54, to evacuate gas in the inner tube 44 from the opening 52 through a space 84 between the inner tube 44 and the outer tube 46. An exhaust section 41 is provided at the gas outlet 82. The exhaust section 41 includes an exhaust passage 86 connected to the gas outlet 82. A pressure regulating valve 88 and a vacuum pump 90 are sequentially interposed in the exhaust passage 86 to evacuate the process chamber 34.

The heater 42 is cylindrical, and is provided around the outer tube 46 so as to cover the outer tube 46. The heater 42 is a heating means for heating wafers W stored within the process chamber 34. The heater 42 is divided into multiple heating regions that are arranged (i.e. stacked) in the vertical direction. Also, from top to bottom, heaters 42a to 42e are provided in the respective heating regions. Outputs of the heaters 42a to 42e are independently controlled by power control units 43a to 43e, respectively.

Further, the thermocouple structure 100 having temperature measuring portions A1 to A5, which are provided corresponding to the heaters 42a to 42e respectively, is disposed near the inner wall of the inner tube 44. In another embodiment, the thermocouple structure 100 may be disposed in a gap between the process chamber 34 and the heater 42.

A controller 95 controls overall operations of the heat treatment apparatus 1. The controller 95 controls heat generation amounts of the heaters 42a to 42e by controlling the power control units 43a to 43e based on temperatures measured by the thermocouple structure 100. The controller 95 may be, for example, a computer or the like. A computer program for controlling the overall operation of the heat treatment apparatus 1 is stored in a storage medium. The storage medium may be, for example, a flexible disk, a compact disk, a hard disk, a flash memory, a DVD, or the like.

According to the heat treatment apparatus 1 described above, because the space-saving thermocouple structure 100 is employed, the thermocouple structure 100 is easily disposed in a narrow space between the inner tube 44 and the wafer boat 38.

Second Embodiment

Figure 8:
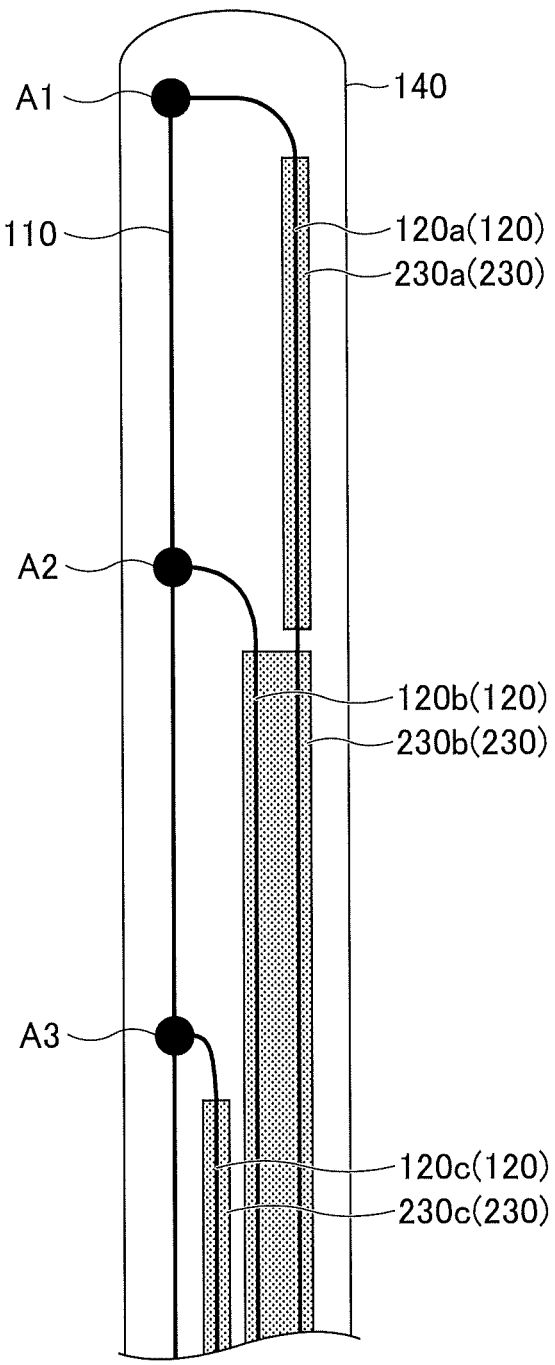
FIG. 8 is a diagram illustrating an example of the configuration of a thermocouple structure according to a second embodiment.

An example of the configuration of a thermocouple structure according to a second embodiment will be described. FIG. 8 is a diagram illustrating the example of the configuration of the thermocouple structure according to the second embodiment.

As illustrated in FIG. 8, the thermocouple structure 200 of the second embodiment differs from the thermocouple structure 100 of the first embodiment in that the second element wires 120a and 120b are covered together with a single covering member 230b. The other configurations of the thermocouple structure 200 are similar to those of the thermocouple structure 100. Hereinafter, points that are different from the thermocouple structure 100 will be mainly described.

The thermocouple structure 200 includes a first element wire 110, second element wires 120, covering members 230, a protective tube 140, a measuring instrument 150, and a switching device 160. In FIG. 8, the measuring instrument 150 and the switching device 160 are not illustrated.

As the covering members 230, the thermocouple structure 200 includes the covering members 230a, 230b, and 230c. The covering member 230a is an insulating tube that covers the second element wire 120a by the second element wire 120a being inserted into the interior of the covering member 230a. The covering member 230b is an insulating tube that covers the second element wires 120a and 120b by the second element wires 120*a* and 120*b* being inserted into the interior of the covering member 230*b*. The covering member 230*c* is an insulating tube that covers the second element wire 120*c* by the second element wire 120*c* being inserted into the interior of the covering member 230*c*. Incidentally, the covering members 230*a* and 230*c* are examples of a first covering member, and the covering member 230*b* is an example of a second covering member.

According to the above-described thermocouple structure 200, a multi-junction thermocouple having three temperature measuring portions A1 to A3 is formed by the first element wire 110 and the three second element wires 120 each constituting a thermocouple with the first element wire 110. As a result, the number of element wires for thermocouple can be reduced in a case of measuring temperatures at multiple points, so that space can be saved and manufacturing cost can be reduced.

Also, according to the thermocouple structure 200, two second element wires 120*a* and 120*b* are covered with the single covering member 230*b*. This allows the thermocouple structure 200 to be more space-saving.

Similar to the thermocouple structure 100, in the thermocouple structure 200, the temperature measuring portions A1 to A3 can be formed by welding, crimping, or the like. Also, similar to the thermocouple structure 100, the thermocouple structure 200 is suitable for temperature measurement in the batch-type heat treatment apparatus 1.

Third Embodiment

Figure 9A:
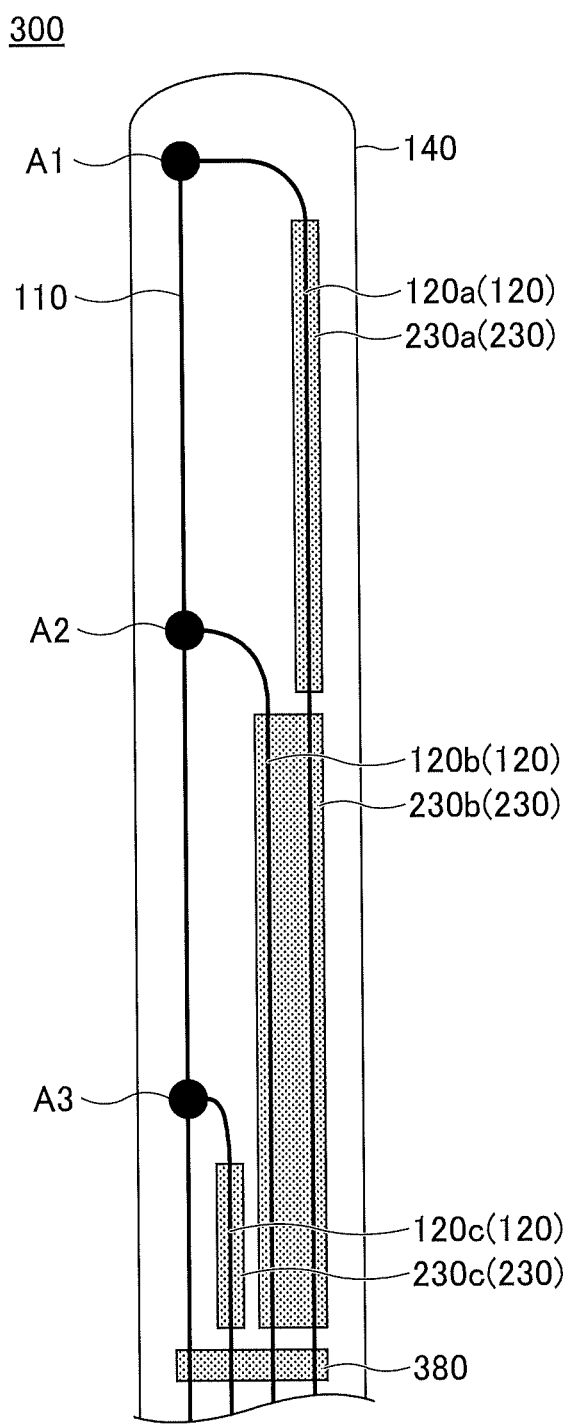
FIGS. 9A and 9B are diagrams illustrating an example of the configuration of a thermocouple structure according to a third embodiment.
Figure 9B:
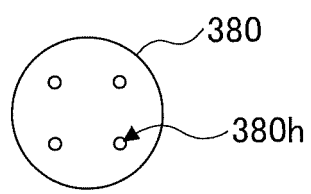

An example of the configuration of a thermocouple structure according to a third embodiment will be described. FIGS. 9A and 9B are diagrams illustrating the example of the configuration of the thermocouple structure according to the third embodiment. FIG. 9A is a schematic view illustrating the thermocouple structure, and FIG. 9B is a plan view of a holding member.

As illustrated in FIG. 9A, the thermocouple structure 300 of the third embodiment differs from the thermocouple structure 200 of the second embodiment in that an insulating holding member 380 is provided, which holds a first element wire 110 and second element wires 120 (120*a*, 120*b*, and 120*c*). Other configurations of the thermocouple structure 300 are similar to those of the thermocouple structure 200. Hereinafter, points that differ from the thermocouple structure 200 will be mainly described.

The thermocouple structure 300 includes the first element wire 110, the second element wires 120, covering members 230, a protective tube 140, a measuring instrument 150, a switching device 160, and the holding member 380. In FIG. 9A, illustration of the measuring instrument 150 and the switching device 160 is omitted.

As illustrated in FIG. 9B, the holding member 380 is a disc-shaped insulating member in which four through-holes 380*h* are formed. The through-holes 380*h* are formed such that the first element wire 110 and the second element wires 120*a*, 120*b*, and 120*c* can be inserted into the respective through-holes 380*h*. By inserting the first element wire 110 and the second element wires 120*a*, 120*b*, and 120*c* into the respective through-holes 380*h* of the holding member 380, a positional relationship between the first element wire 110 and the second element wires 120*a*, 120*b*, and 120*c* can be maintained. Therefore, when the first element wire 110 and the second element wires 120*a*, 120*b*, and 120*c* are inserted into the protective tube 140, it is possible to prevent displacement in the positional relationship between the first element wires 110 and the second element wires 120*a*, 120*b*, and 120*c*.

According to the thermocouple structure 300 described above, a multi-junction thermocouple having three temperature measuring portions A1 to A3 is formed by the first element wire 110 and the three second element wires 120 each constituting a thermocouple with the first element wire 110. As a result, the number of thermoelectric element wires for thermocouple can be reduced in a case of measuring temperatures at multiple points, so that space can be saved and manufacturing cost can be reduced.

According to the thermocouple structure 300, the second element wire 120*b* is covered with the covering member 230*b* that is commonly used by the second element wire 120*a*. This allows the thermocouple structure 300 to be more space-saving.

Further, according to the thermocouple structure 300, the holding member 380 retains the positional relationship between the first element wire 110 and the second element wires 120*a*, 120*b*, and 120*c*. Therefore, when the first element wire 110 and the second element wires 120*a*, 120*b*, and 120*c* are inserted into the protective tube 140, it is possible to prevent displacement in the positional relationship between the first element wire 110 and the second element wires 120*a*, 120*b*, and 120*c*.

In the thermocouple structure 300, similar to the thermocouple structure 100, the temperature measuring portions A1 to A3 can be formed by welding, crimping, or the like. The thermocouple structure 300, as well as the thermocouple structure 100, is also suitable for temperature measurement in the batch-type heat treatment apparatus 1.

The embodiments disclosed herein should be considered to be exemplary in all respects and not restrictive. The above embodiments may be omitted, substituted, or modified in various forms without departing from the appended claims and spirit thereof.

What is claimed is:
1. A thermocouple structure comprising:
a first element wire, the first element wire including
a first end,
a second end opposite the first end, and
an intermediate portion between the first end and the second end;
second element wires formed of a material different from the first element wire, each of the second element wires being bonded to a different position on the first element wire;
an insulating covering member covering at least one of the first element wire and the second element wires;
a protective tube accommodating the first element wire and the second element wires;
a clamping member clamping the intermediate portion of the first element wire and a given second element wire among the second element wires, wherein the clamped intermediate portion of the first element wire and the given second element wire at an end thereof directly contact each other; and
an insulating holding member that holds the first element wire and the second element wires, the insulating holding member being disposed within the protective tube, and having holes,
wherein the first element wire and the second element wires pass through the respective holes such that the first element wire and the second element wires are spaced apart from one another, wherein each second element wire is bonded to the first element wire by clamping the second element wire and the first element wire, and wherein the first element wire comprises two element wires, the two element wires being bonded to each other at the intermediate portion at which the clamping member clamps the two element wires and the given second element wire.

2. The thermocouple structure according to claim 1, wherein the insulating covering member covers at least one of the second element wires.

3. The thermocouple structure according to claim 2, wherein the insulating covering member includes a first covering member that covers one of the second element wires, and includes a second covering member that covers a plurality of element wires of the second element wires.

* * * * *